United States Patent [19]
Hu

[11] Patent Number: 5,861,338
[45] Date of Patent: Jan. 19, 1999

[54] CHANNEL STOP IMPLANT PROFILE SHAPING SCHEME FOR FIELD ISOLATION

[75] Inventor: Chung-You Hu, Sunnyvale, Calif.

[73] Assignee: Advanced Micro Devices, Inc., Sunnyvale, Calif.

[21] Appl. No.: 786,815

[22] Filed: Jan. 21, 1997

[51] Int. Cl.$^6$ .................................................. H01L 21/76
[52] U.S. Cl. .......................................... 438/450; 438/981
[58] Field of Search ................................... 438/450, 524, 438/229, 981

[56] References Cited

U.S. PATENT DOCUMENTS

| | | |
|---|---|---|
| 4,994,407 | 2/1991 | Custode et al. . |
| 5,358,890 | 10/1994 | Sivan et al. . |
| 5,372,951 | 12/1994 | Anjum et al. . |
| 5,679,602 | 10/1997 | Lin et al. . |

Primary Examiner—George Fourson
Attorney, Agent, or Firm—Sawyer & Associates

[57] ABSTRACT

The present invention is a semiconductor device and a method of providing such a semiconductor device which allows a high junction breakdown voltage and a high field turn on voltage, while allowing the field oxide thickness to be limited and being independent of a misalignment of the mask. A method in accordance with the present invention for providing a semiconductor device including a field oxide, the field oxide including a field oxide boundary wherein the field oxide is located within the boundary, the method comprising the step of implanting a first implant area into the substrate, including areas proximate indistance to a junction area, the first area being implanted with a first implant concentration and implanting a second implant area distal to the junction area, the second implant area being implanted with a second implant concentration, wherein the depth of the implant is controlled by the energy level, wherein the implant of the second implant area is independent of a misalignment of a mask.

5 Claims, 13 Drawing Sheets

CHANNEL STOP IMPLANT PROFILE SHAPING SCHEME FOR FIELD ISOLATION

FIELD OF THE INVENTION

The present invention relates to semiconductor devices, more particularly, the present invention relates to using a channel stop implant which is independent of misalignments of a mask in a semiconductor device and a method for providing such a semiconductor device.

BACKGROUND OF THE INVENTION

As semiconductor devices become progressively smaller, conventional methods of solving existing problems are becoming obsolete. One such problem is to avoid what is referred to as "junction breakdown". Junction breakdown is a phenomenon which short circuits the semiconductor devices such as those used in nonvolatile memory. Another such problem is to increase what is referred to as the "field turn on voltage". Field turn on voltage is the voltage at which the field oxide located between the various transistors or devices, typically located in a memory, allows communication between the devices. It is desirable to provide a field turn on voltage high enough to prevent communication between the various devices.

To increase the junction breakdown voltage, the field implant concentration can be lowered. However, to increase the field turn on voltage, either the field oxide thickness can be increased or the field implant concentration can be increased. If the field implant concentration is increased, however, it will result in an undesirable decrease of the junction breakdown voltage.

The conventional method for increasing the junction breakdown voltage is to lower the field implant concentration. The conventional method for increasing the field turn on voltage is to use a thick field oxide. However, as the semiconductor devices become increasingly smaller, the range of acceptable field oxide thicknesses become increasingly more limited.

For further background information regarding issues involving semiconductor manufacturing, see *Silicon Processing for VLSI Era vol. II, Processing Integration*, by Stanley Wolf, Lattice Press, 1990; and *Semiconductor Devices Physics and Technology*, S. M. Sze, 1985, copyright to Bell Labs.

One solution, such as the channel stop implant architecture manufactured by Advanced Micro Devices, Inc., solves the problem of increasing the junction breakdown voltage and increasing the field turn on voltage while limiting the oxide thicknesses. This architecture uses a low field implant concentration to increase junction breakdown voltage and an area with high field implant concentration located away from the source/drain junction to increase the field turn on voltage. Although this architecture is acceptable for many applications, it is dependent upon correct alignment of a mask used in producing the area with the high field implant concentration located away from the source/drain junction. If this mask is misaligned, the high field implant concentration area may be created too close to the source/drain junction, thus decreasing the junction breakdown voltage.

There is a need for a device and method for providing a semiconductor device which provides for a high junction breakdown voltage and a high field turn on voltage which does not require a thick field oxide and is independent of a misalignment of the mask. The present invention addresses such a need.

SUMMARY OF THE INVENTION

The present invention is a semiconductor device and a method of providing such a semiconductor device which allows a high junction breakdown voltage and a high field turn on voltage, while allowing the field oxide thickness to be limited and being independent of a misalignment of the mask.

A method in accordance with the present invention for providing a semiconductor device including a substrate, a field oxide, the field oxide including a field oxide boundary wherein the field oxide is located within the boundary, the method comprising the step of implanting a first implant area into the substrate, including areas proximate indistance to a junction area, the first area being implanted with a first implant concentration and implanting a second implant area distal to the junction area the second implant occurring at a specific energy level, wherein the depth of the implant is controlled by the energy level, the second implant area being implanted with a second implant concentration wherein the implant of the second implant area is independent of a misalignment of a mask.

The present invention utilizes a field oxide with an uneven surface such that the field oxide is preferably thinner in the center than the outer edges. The present invention also utilizes a low field implant concentration to increase the junction breakdown voltage. Additionally, it utilizes an area with a high field implant concentration located away from the source/drain junction to increase the field turn on voltage. The two areas of concentration, with the high field implant concentration located away from the source/drain junction, eliminates the need for a thick field oxide. The nonuniform surface of the field oxide provides for a field oxide which is thicker at the ends closest to the source/drain junction than the center which is distal from the source/drain junction. This configuration allows for a staggering of the field implant concentration such that the concentration is highest below the center of the field oxide and allowing the concentration to become exponentially lower as it nears the source/drain junction. The energy used for the high field implant may be adjusted such that the penetration depth for the peak concentration is approximately equal to the thickness of the field oxide at the center. This configuration of the high concentration of the field implant allows the semiconductor to be independent of a misalignment of the mask used during the creation of the area with the high field implant concentration located away from the source/drain junction.

DESCRIPTION OF THE INVENTION

The present invention relates to a semiconductor device using a channel stop implant which is independent of misalignments of a mask and a method for providing such a semiconductor device. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1A:
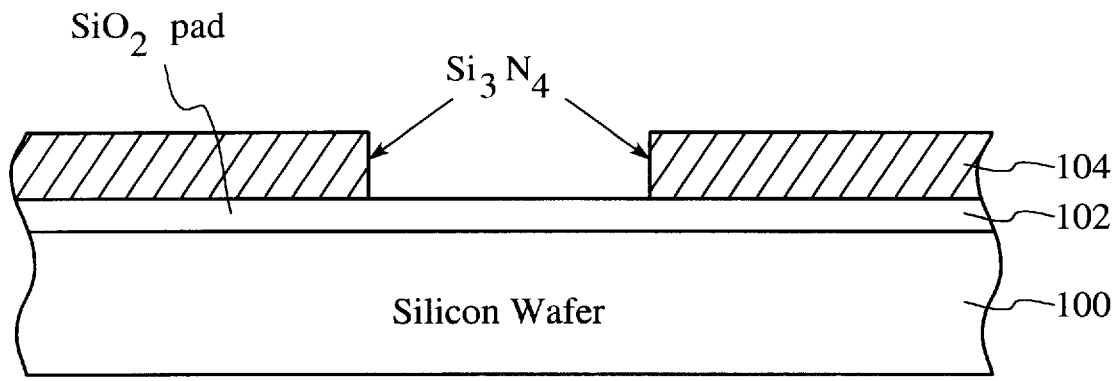
FIGS. 1A–1C illustrate the basic steps used in a conventional method for growing a field oxide.
Figure 1B:
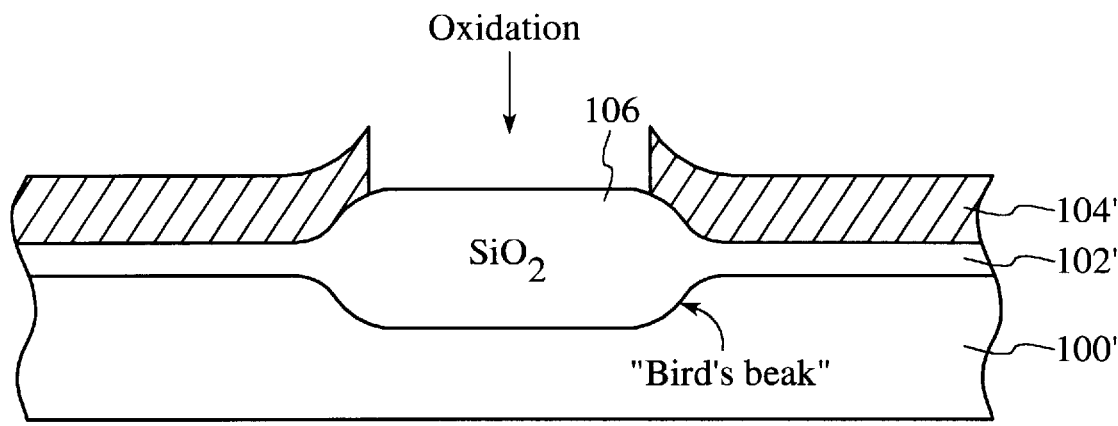
Figure 1C:
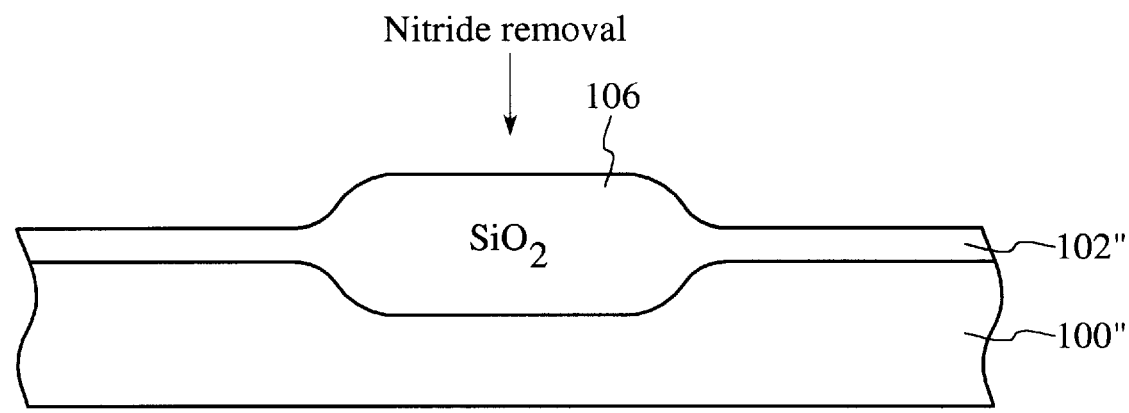

FIG. 1A–1C illustrate basic steps used to fabricate conventional semirecessed local oxidation of silicon (LOCOS) structures, hereinafter referred to as field oxide. FIG. 1A shows a configuration with a silicon wafer 100, a silicon dioxide pad 102, and a layer of silicon nitride 104. This structure is exposed to oxidation, resulting in a smooth surface field oxide 106 as shown in FIG. 1C.

As previously discussed, many of the conventional architecture utilizing semiconductor devices for memory fail to simultaneously meet the desired goals of (1) increasing the field turn on voltage high enough to prevent communication between devices; (2) increasing the junction breakdown voltage high enough to keep the devices from shorting out; and (3) limit the field oxide thickness to allow for smaller memory cell devices.

One method for simultaneously solving the problem of increasing the junction breakdown voltage and increasing the field turn on voltage while limiting the oxide thickness is utilized in an architecture manufactured by Advanced Micro Devices, Inc., known as the channel stop implant architecture.

Figure 2:
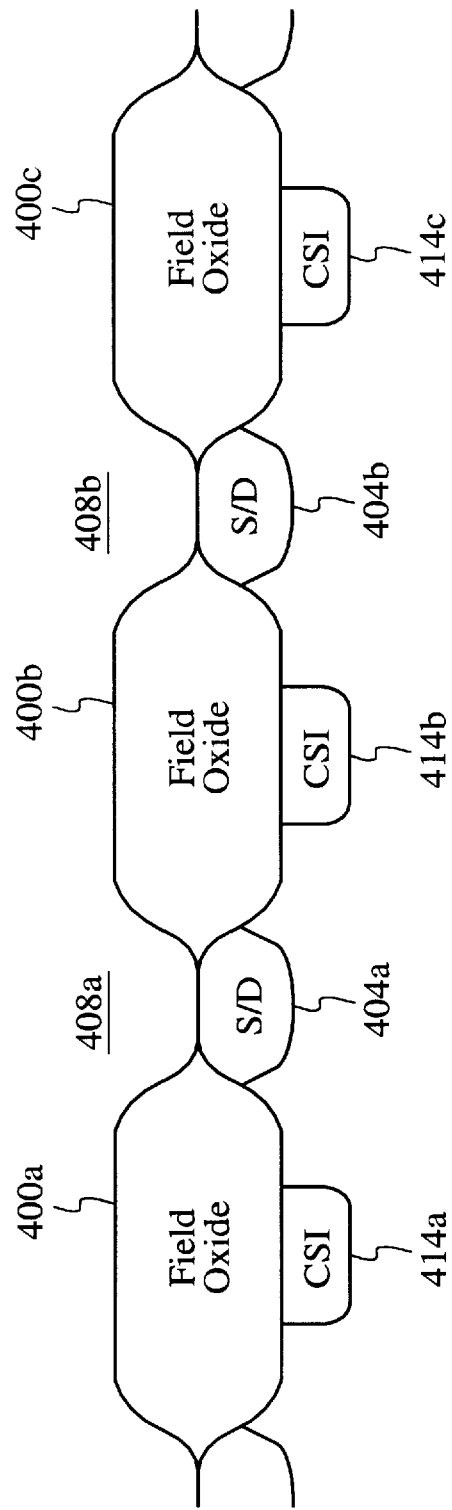
FIG. 2 shows a device and method utilizing low implant concentration with an area of high implant concentration, the device utilizes field oxides generated by the method shown in FIGS. 1A–1C.

FIG. 2 shows an example of a channel stop implant architecture which typically utilizes field oxides generated by the method shown in FIGS. 1A–1C. This architecture includes semiconductor source/drain areas 404a–404b, separated by field oxide 400b, with other source/drain areas likewise being separated from other source/drain areas by field oxide 400a and 400c. This channel stop implant architecture also includes localized channel stop implants (CSI) 414a–414c.

The purpose of the field oxide 400 is to isolate devices which include source/drain areas 404 to ensure a lack of communication between the devices. The voltage at which the field oxide 400 allows communication between devices is known as "field turn on voltage". It is desirable to provide a field turn on voltage high enough to prevent communication between devices. Field turn on voltage is roughly proportional to the field oxide thickness multiplied by field implant concentration. As the semiconductor devices become smaller, the range of acceptable field oxide thicknesses become more limited.

During operation, it is desirable to have current flowing only in a channel region (not shown) of the devices. If a current is allowed to flow between the various devices in the memory, the devices can essentially short circuit. This phenomenon is referred to as "junction breakdown". It is desirable to have the junction breakdown voltage high enough to avoid junction breakdown.

After the CSI 414 is implanted, the junction breakdown voltage may need to be higher than 8–10 v to avoid junction breakdown. A junction breakdown problem can be caused by the narrowness of the space between source/drains 404a and 404b. When CSI 414b gets too close to either source/drain 404a or 404b, then the likelihood of junction breakdown will be great.

Another factor which depends on the location of CSI 414 is junction capacitance. It is desirable to have junction capacitance as small as possible. Since junction capacitance is dependent upon the distance between the source/drain 404 and CSI 414, if the CSI 414 is located too close to the source/drain 404, then junction capacitance becomes larger. Therefore, it is desirable to have CSI 414b substantially equidistant between the two source/drains 404a and 404b. Hence, misalignment of CSI 414 can cause substantial problems.

The substrate 408a–408b preferably contains a low field implant concentration to meet the requirement of increasing the junction breakdown voltage. Additionally, the CSI region 414a–414c preferably has a high field implant concentration, such as CSI greater than $3 \times 10^{17}$ cm$^{-3}$. The CSI region 414a–414c should be located away from the source/drain 404 junction to avoid any potential junction breakdown problems. The distance between the source/drain 404a, 404b and the CSI region is preferred to be as large as possible to avoid junction breakdown and minimize junction capacitance.

Figure 3:
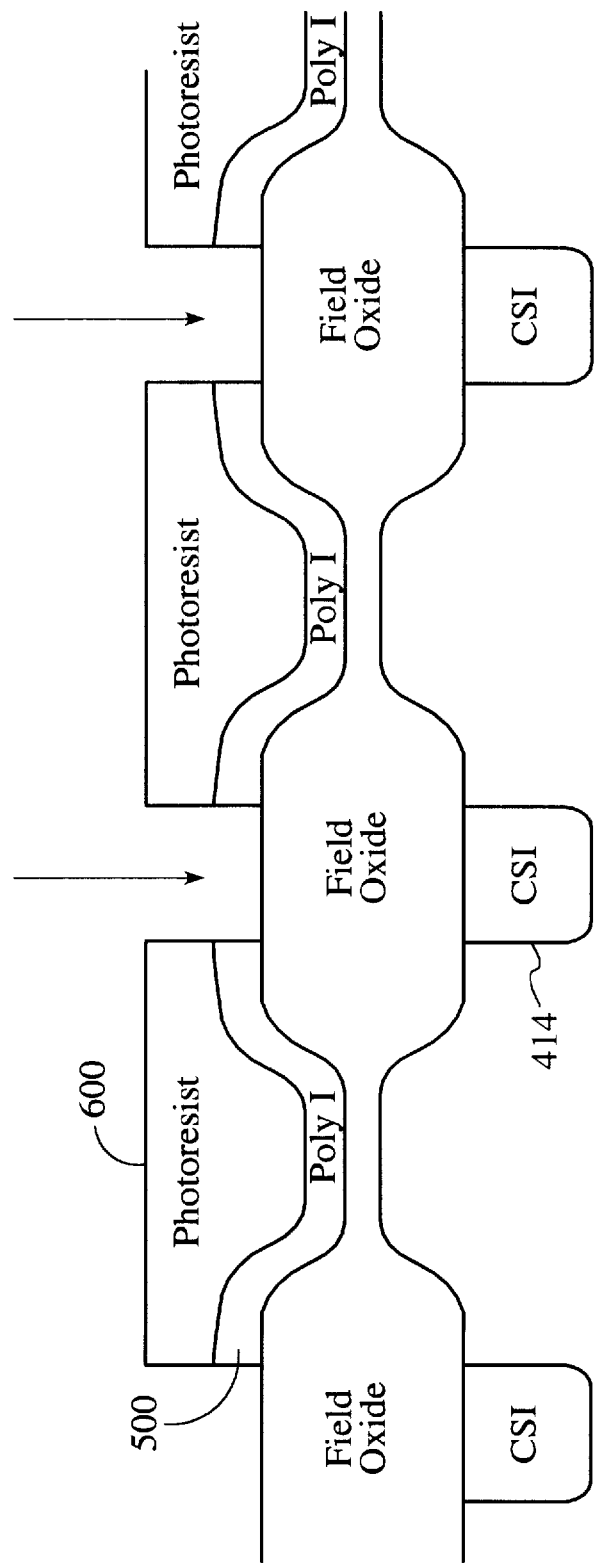
FIG. 3 shows an implantation phase for obtaining the area of high implant concentration of the device shown in FIG. 2.

FIG. 3 illustrates a method for producing the CSI 414 region. As shown in FIG. 3, the CSI 414 region already known in the art results from the ion implantation step typically performed after etching the poly-I layer 500. The poly-I definition step is well known in the art and is not described herein for simplicity. The poly-I definition step is merely one example of accomplishing the CSI 414 deposition. Use of a photoresist layer 600 without the poly-I is another example of accomplishing the CSI 414, as shown in FIG. 2.

Figure 4A:
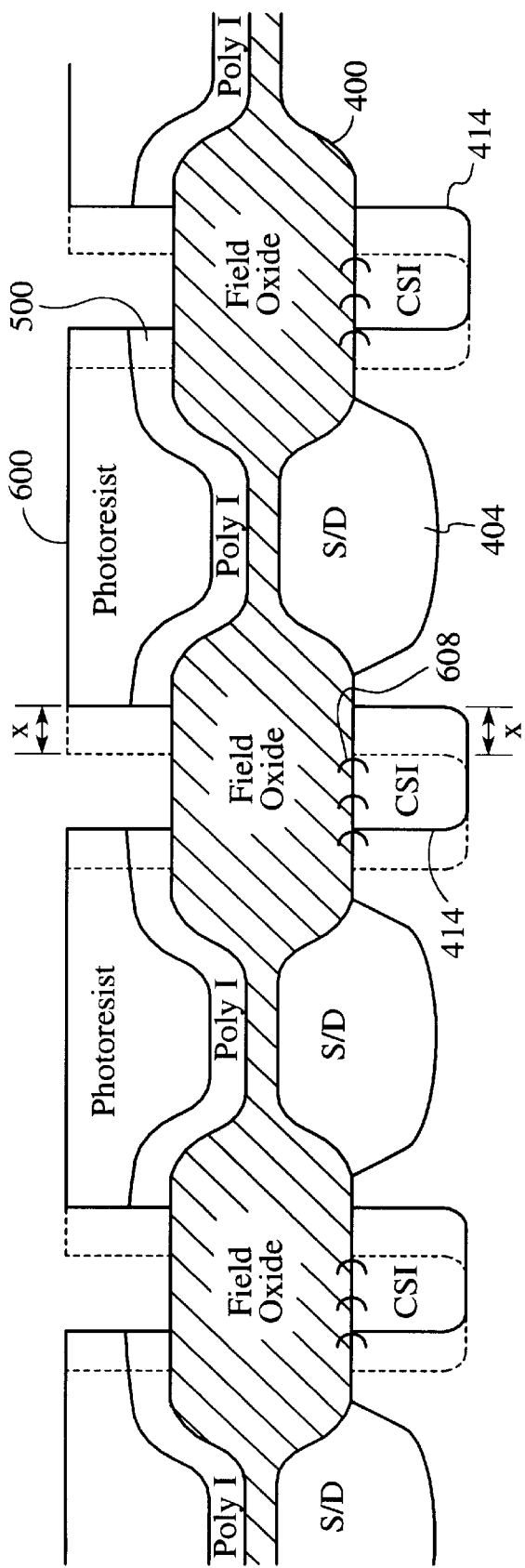
FIG. 4A shows the locations of the field implant concentrations for the situation where the mask is aligned and where the mask is misaligned.
Figure 4B:
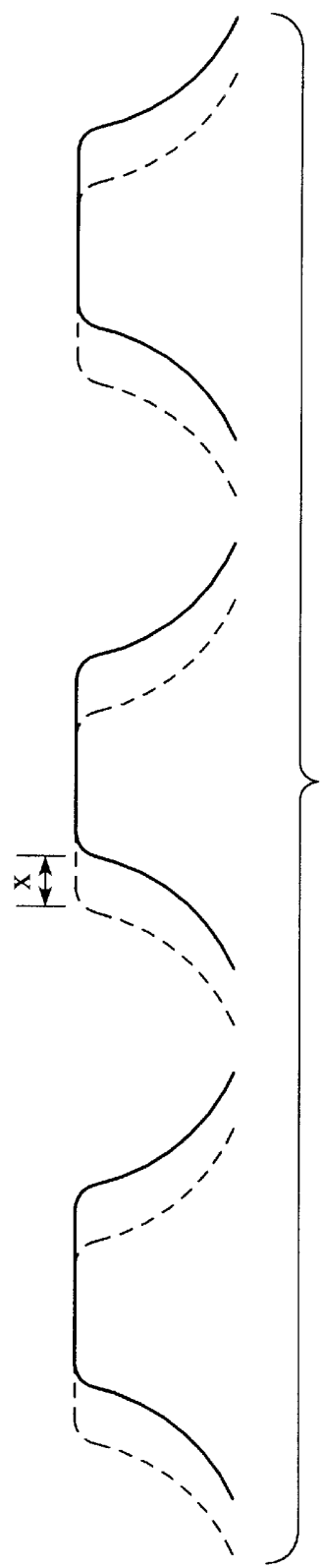
FIG. 4B illustrates the distribution of the implant concentration.

FIGS. 4A–4B illustrate a problem associated with the channel stop implant architecture shown in FIGS. 2 and 3 which the present invention addresses. If the photoresist 600 or the poly-I layer 500, depending on what method is used to protect from the implant, is misaligned from the target position by a distance of x, then the CSI 414 will also be misaligned by a distance of x. This misalignment is also likely to shift the implant concentration as shown in FIG. 4B. When the implant concentration is shifted then there is a danger of the high implant concentration in the CSI 414 becoming too close to the source/drain junction 404. The proximity of the high implant concentration area can cause potential junction breakdown problems.

In FIG. 4A, the peak concentration of the implant is typically lined up at the edge of the field oxide as shown by the concentration curve 608. Hence, the implant profile shown in FIG. 4B has a uniform flat peak with the ends dropping off exponentially.

The present invention utilizes the distribution of the concentration level of the implant to avoid the problem of misalignment. A method according to the present invention is shown in FIG. 5.

Figure 5:
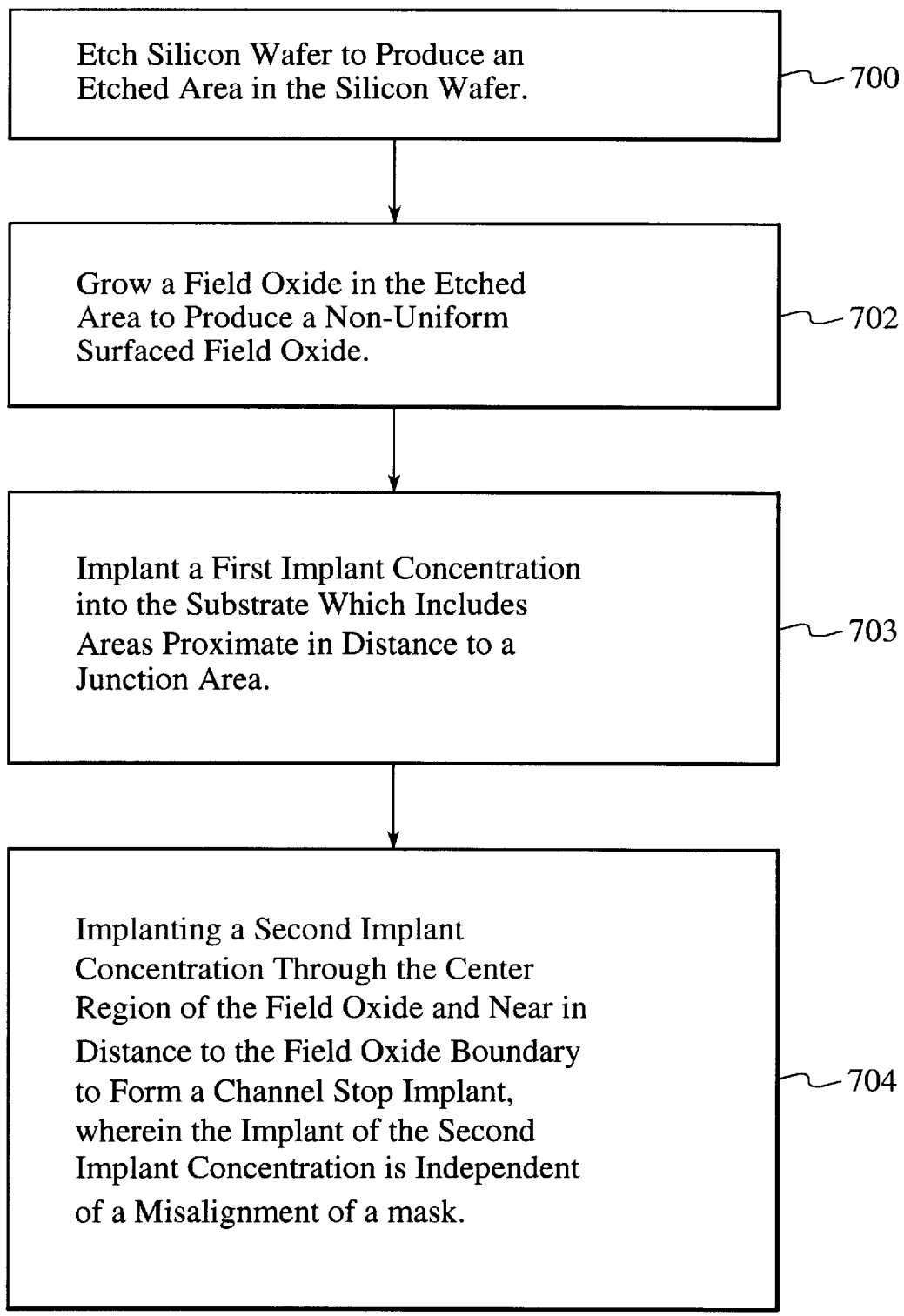
FIG. 5 is a flow diagram of a method according to the present invention.
Figure 10:
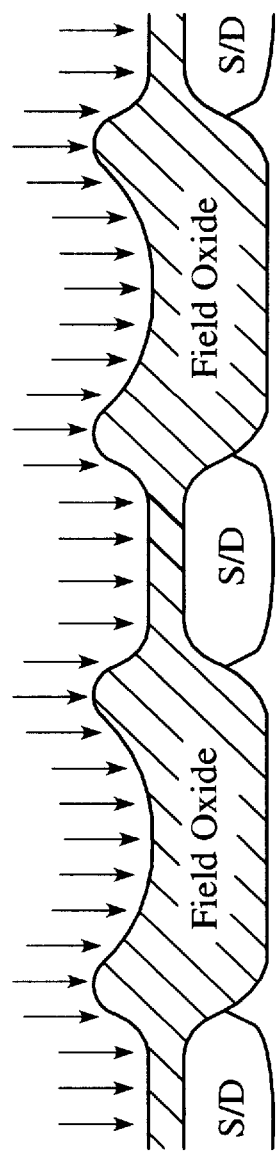
FIG. 10 illustrates the first implant into the substrate where the area implanted includes areas proximate in distance to the junction in accordance with the present invention.

FIG. 5 is a flow diagram of a method according to the present invention. The silicon wafer is etched to produce an etched area in the silicon wafer via step 700. A field oxide is then grown in the etched area to produce an uneven surface field oxide via step 702. Both steps 700 and 702 use known processes in the art. A first implant area is then into the substrate implanted with an implant concentration wherein the first implant area includes areas proximate in distance to the source/drain junction via step 703 as illustrated by FIG. 10. Using a mask, a second implant area is implanted with an implant concentration higher than the implant concentration of the first implant area via step 704. The second implant area is distal to the junction area. Additionally, the implant of the second implant area is independent of a misalignment of a mask.

Figure 6A:
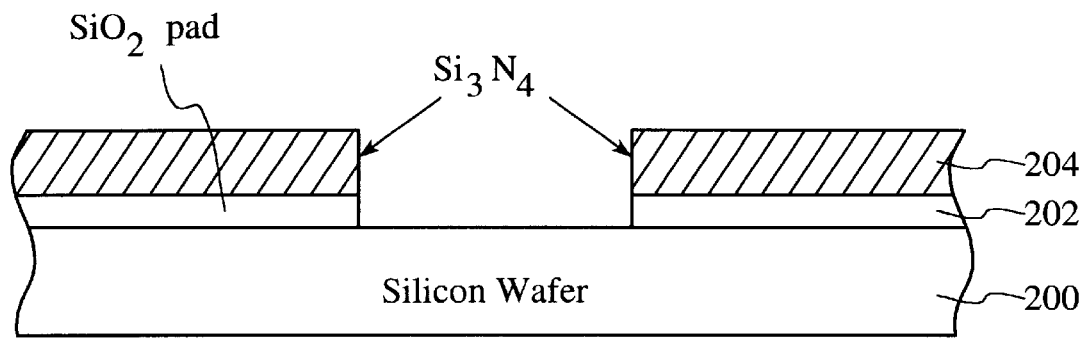
FIGS. 6A–6G show a device and method according to the present invention.
Figure 6B:
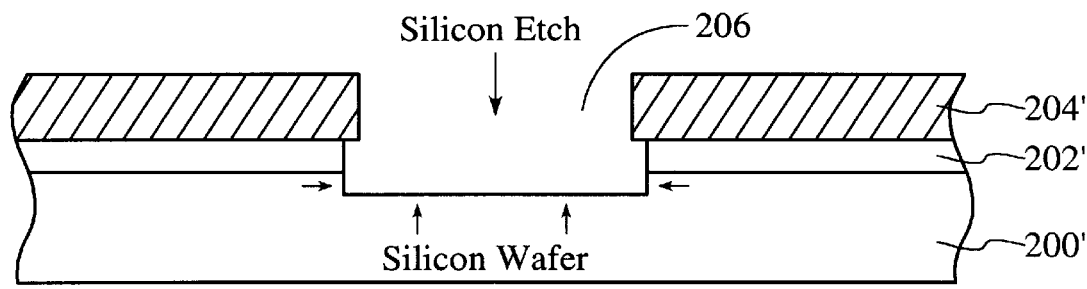
Figure 6C:
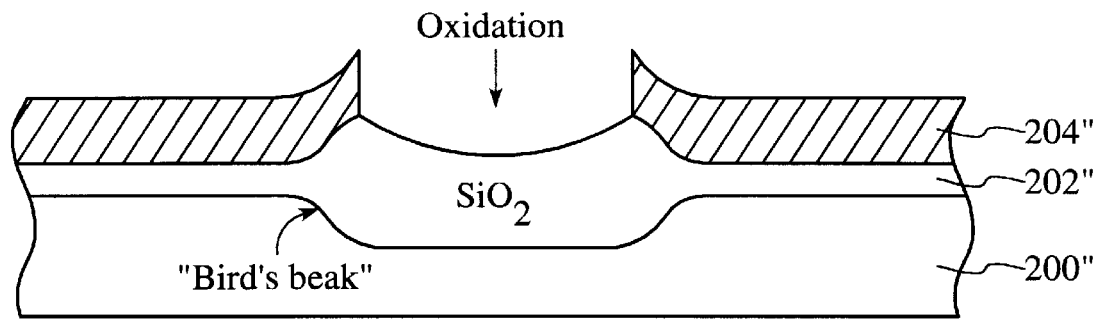
Figure 6D:
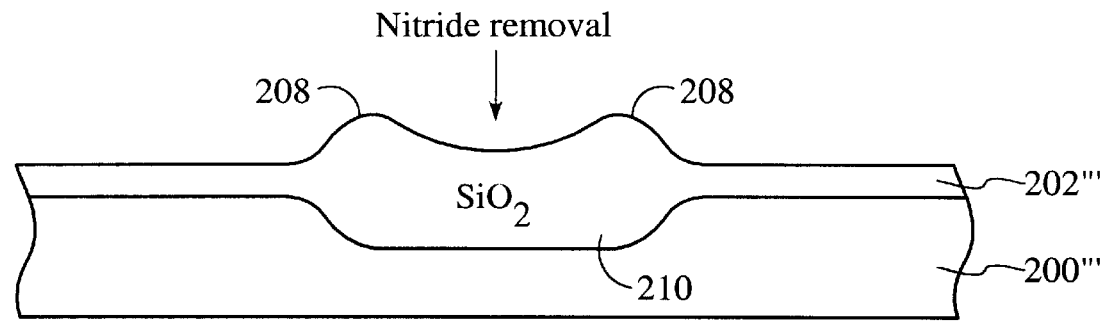

FIGS. 6A–6D show a known method for producing a field oxide to be used with the semiconductor device of the present invention. FIG. 6A shows a structure with a silicon wafer 200, a silicon dioxide pad 202, and a layer of silicon nitride 204. As shown in FIG. 6B, in addition to the silicon dioxide pad 202' being etched, a portion of the silicon wafer 200' is also etched, thereby leaving a vacated section 206 (via step 700). As shown in FIG. 6C, the structure is exposed to oxidation and the silicon nitride is removed as shown in FIG. 6D. The resulting field oxide 210 has an uneven surface, in particular it is thicker in thickness on the outer ends of the field oxide 210 where bumps 208 are shown (via step 702).

Figure 6E:
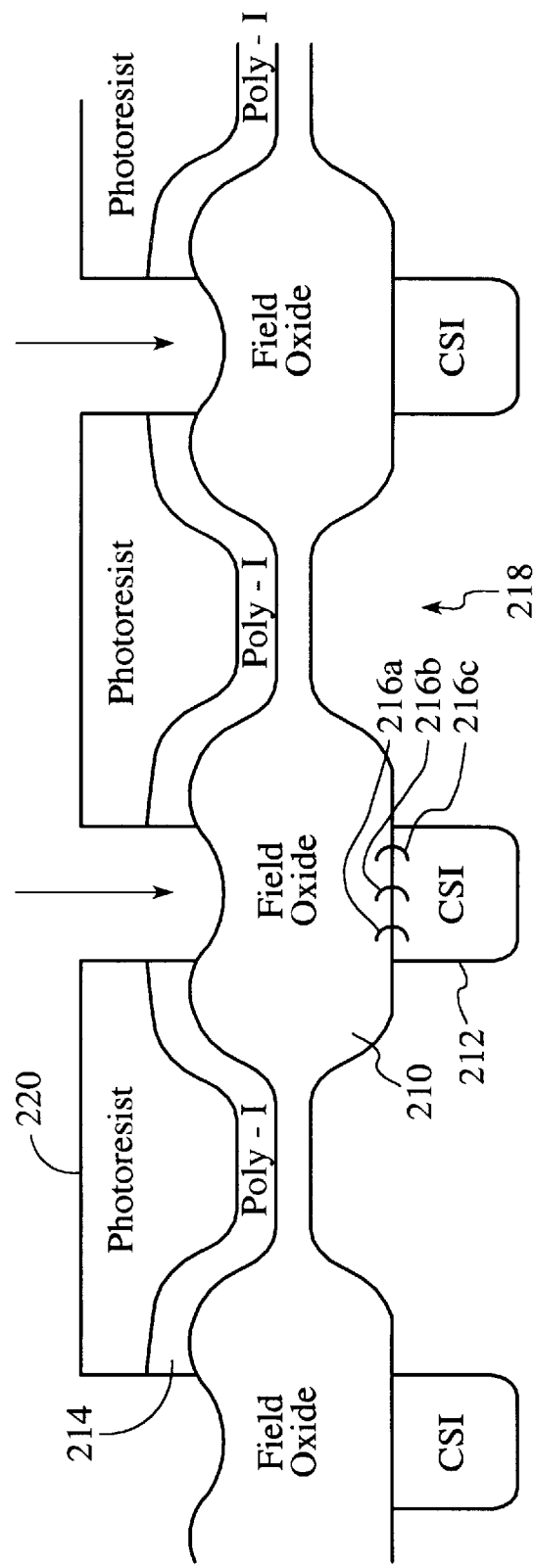

FIG. 6E shows an example of the development of the high implant region (CSI) 212 used in the semiconductor device of the present invention (via step 704). The CSI 212 region has a higher implant concentration than the substrate implant region 218. The creation of the substrate implant region 218 (via step 703) is performed using conventional methods. One way the CSI region can result is from the ion implantation step typically performed after etching the poly-I layer 214. The poly-I definition step is well known in the art and is not described herein for simplicity. The poly-I patterns are then removed after the poly-I definition step to produce the device shown in FIG. 6F. Another example of how the CSI region can be formed is from the ion implantation step performed after positioning a layer of photoresist material 220. These procedures are well known in the art and are not described herein for simplicity. The energy of the implant is chosen such that the penetration depth for the peak concentration of the implant is approximately equal to the thickness of the thinner portion in the center of the field oxide. When a substantially uniform implantation is performed, a peak concentration 216a and 216c of the implant is preferably within the boundaries of the field oxide 210 for the outer regions of the implant. Near the center region of the field oxide 210, the peak concentration 216b is immediately below the boundaries of the field oxide 210.

The following illustrate show the manipulation of the energy of the high implant results in its independence from a misalignment of a mask.

Figure 7A:
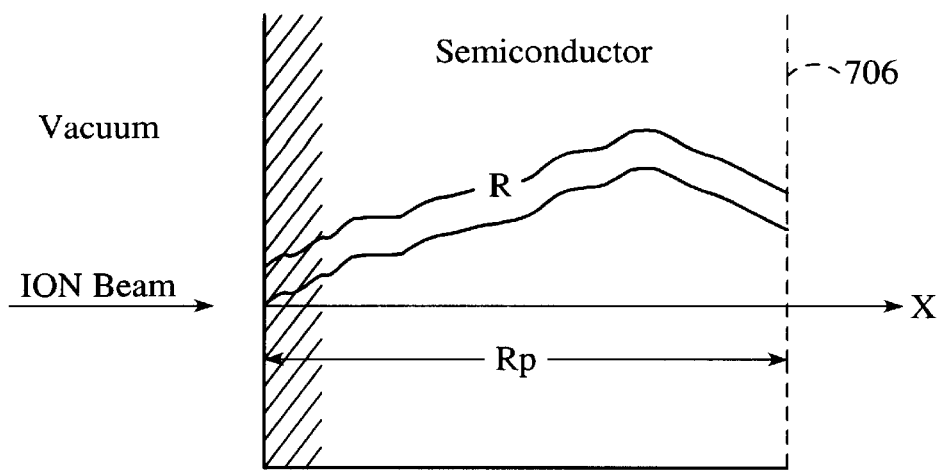
FIGS. 7A–7B show the penetration of the peak implant concentration into the substrate.
Figure 7B:
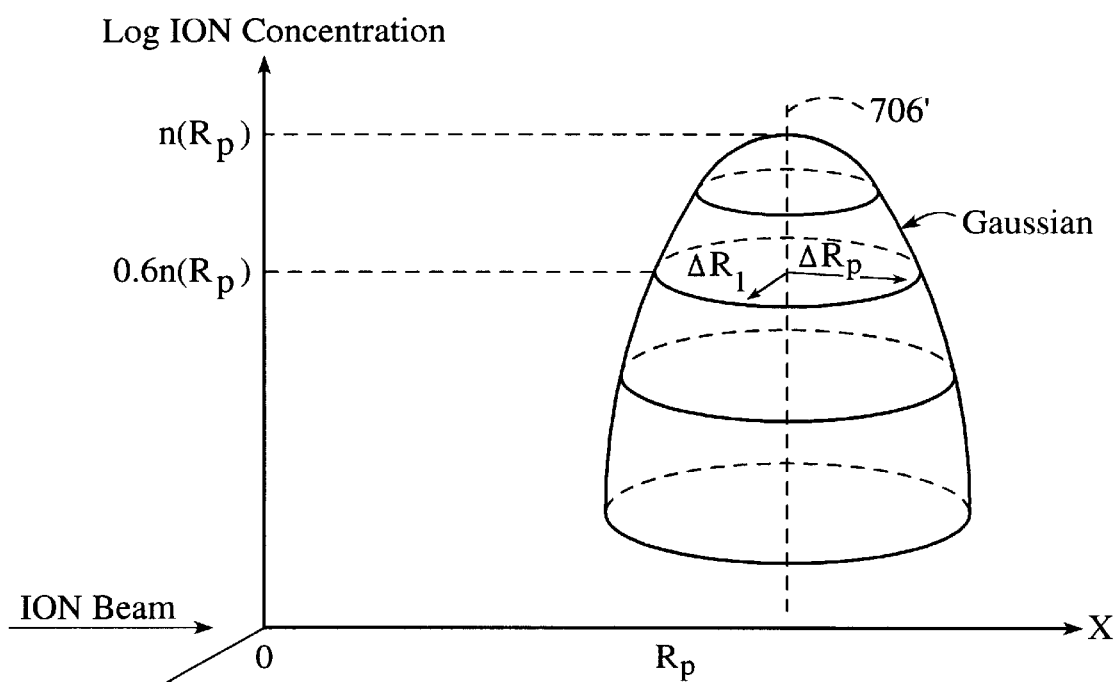

FIGS. 7A and 7B illustrate the distribution of the implant concentration. FIG. 7A illustrates the ion beam of the implant as it penetrates the semiconductor. The point of peak concentration is shown at position 706 which is a distance $R_p$ from the surface of the semiconductor.

FIG. 7B illustrates the implant concentration distribution within the semiconductor. The concentration typically decreases exponentially from the point peak concentration at 706'.

Figure 8:
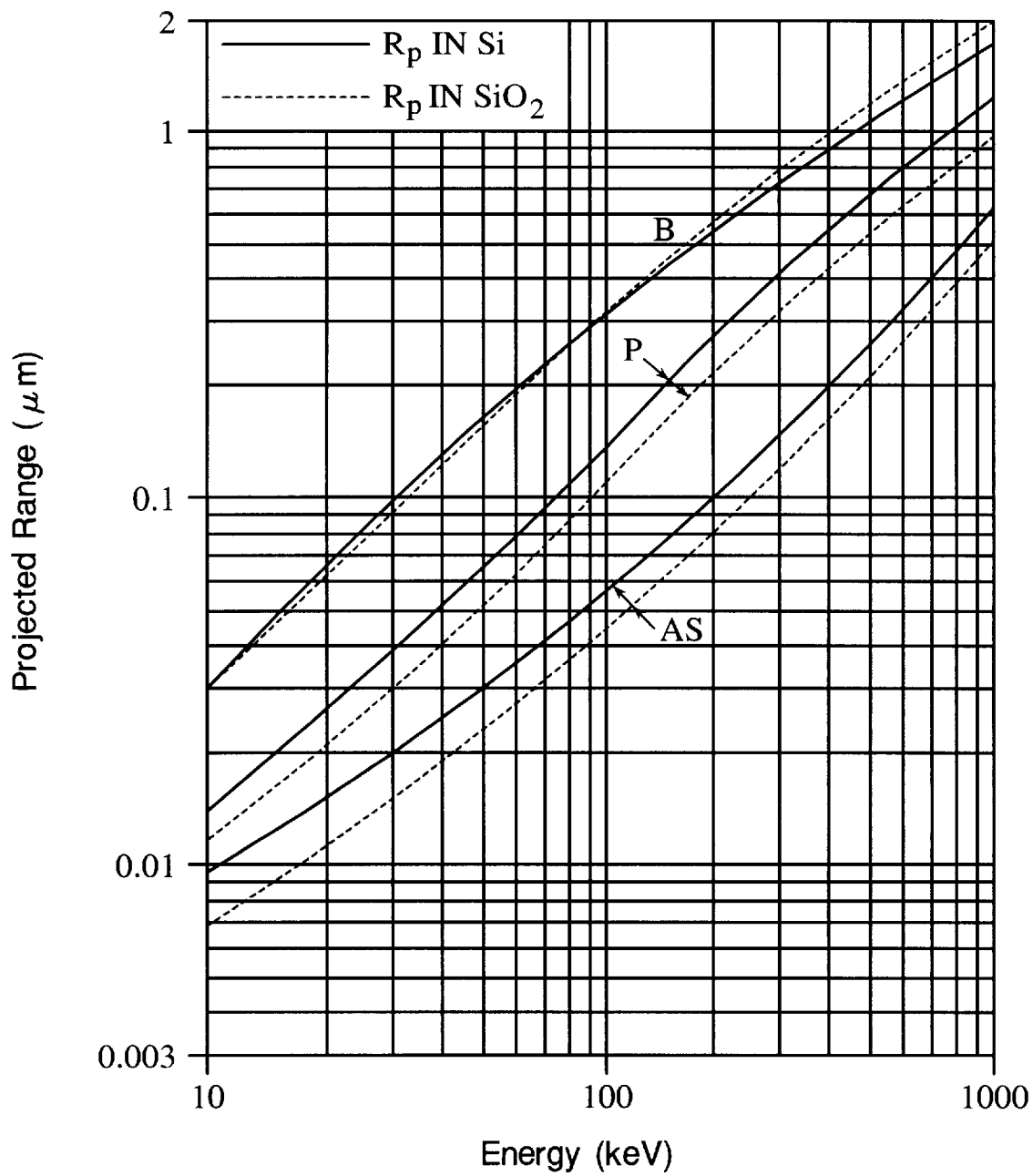
FIG. 8 shows a chart of the projected range of the implant compared to the amount of energy required.

FIG. 8 shows a chart of the projected range of the implant compared to the amount of energy required. A typical implant material is Boron, which is indicated on the charts by the letter B. This chart can be used to estimate the amount of energy required to position the peak concentration of the implant in a desired location.

Figure 9:
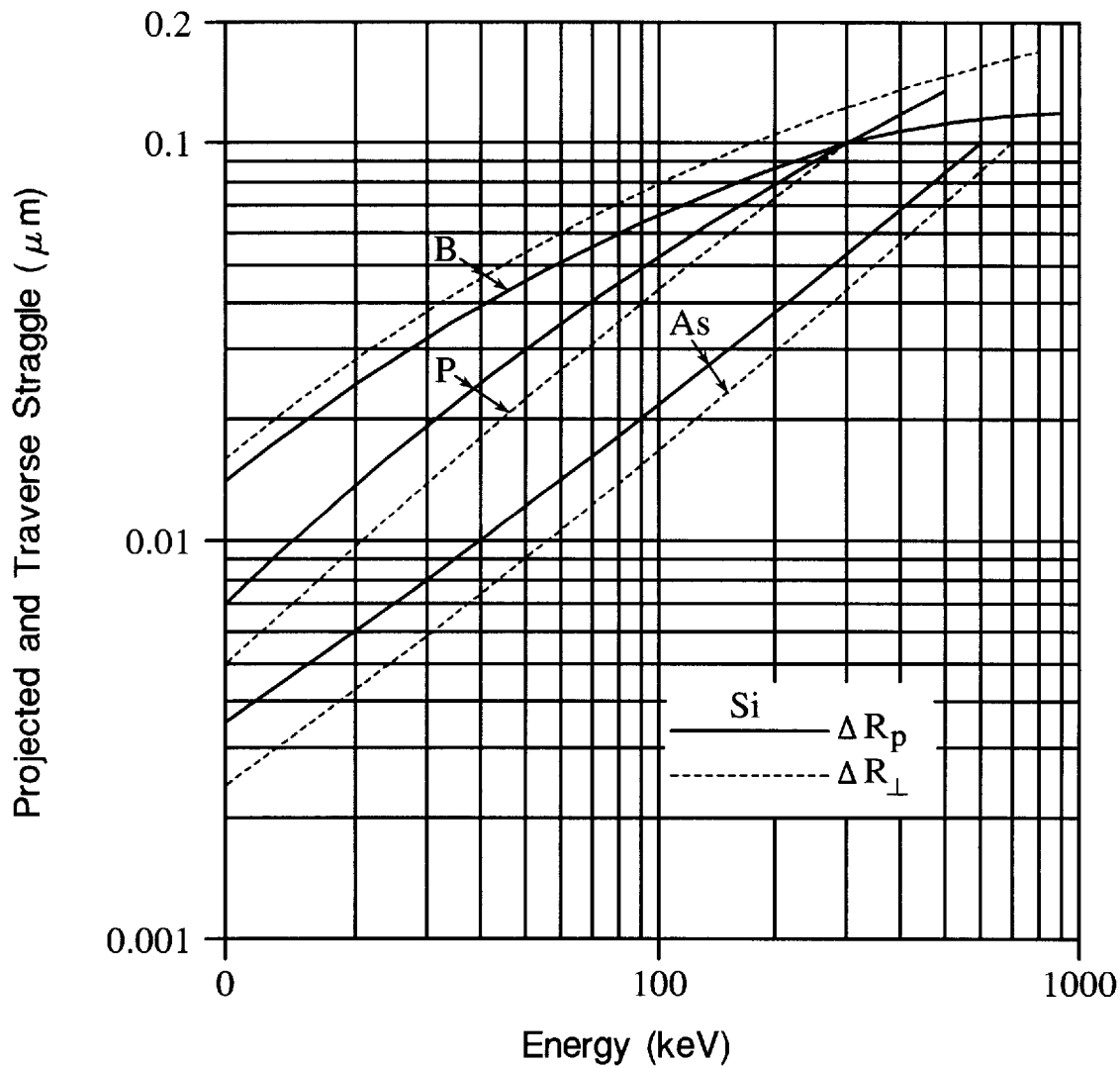
FIG. 9 is a chart showing the projected and transverse straggle compared to the amount of energy required.

FIG. 9 is a chart showing the projected and transverse straggle compared to the amount of energy required. The straggle, as herein referred to, indicates the distance from the peak concentration 706' to the gaussian distribution curve as shown in FIG. 7B. This chart can be used to estimate the concentration of the straggle when the peak concentration of the implant is within the field oxide boundary.

Figure 11A:
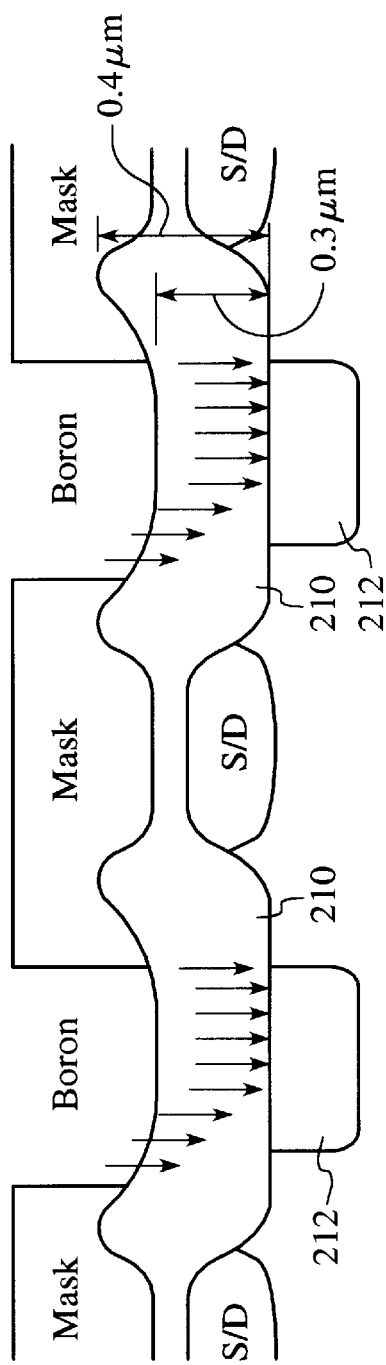
FIG. 11A–11B illustrates the independence of the second implant from a misalignment of the mask in accordance with the present invention.
Figure 11B:
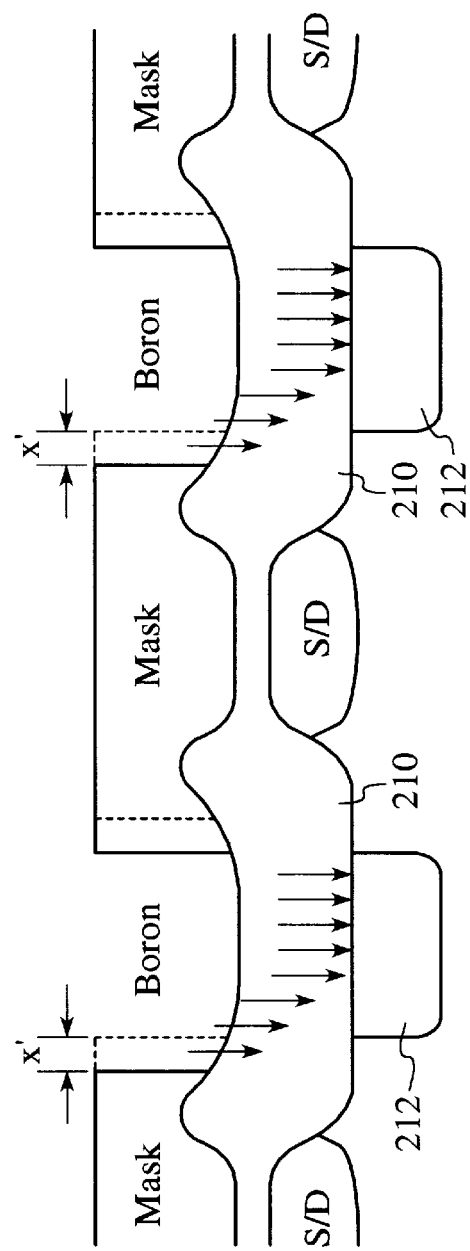

For Example, FIG. 11A illustrates an implant without misalignment. FIG. 11B shows that the same CSI region 212 is formed even with a misalignment of the mask by distance x' In this example, assume the thickness of the field oxide 210 from its center surface to the area immediately below the field oxide boundary is approximately 0.3 $\mu$m. Rp is therefore equal to 0.3 $\mu$m. Assume also the thickness of the outer areas of the field oxide 210 is approximately 0.4 $\mu$m and that Boron will be implanted. The desired depth of the implant penetration is thus approximately 0.3 $\mu$m. Using FIG. 8, the energy for the implant is between 90–100 keV. Once the energy is decided, the traverse straggle is set. FIG. 9 indicates that the traverse straggle for our chosen energy is approximately 0.08 $\mu$m. The difference in thickness between the center and the ends of the field oxide is 0.1 m. Since the $\Delta$Rp is less than 0.1 m, the implant will not penetrate past the outer areas of the field oxide into the silicon underneath. This holds true even if the mask is misaligned by distance x' as illustrated by FIG. 11B. Thus, the implant of the CSI area is independent of a misalignment of the mask. Consequently, the implant concentration falls exponentially as shown in FIG. 7B The implant concentration configuration of the present invention provides a high implant CSI region 212 which has a high implant concentration such as larger than $3\times10^{17}$ cm$^{-3}$ under the center region of the field oxide 210 while having a much smaller concentration such as less than $1\times10^{17}$ cm$^{-3}$ under the outer region of the field oxide.

Figure 6F:
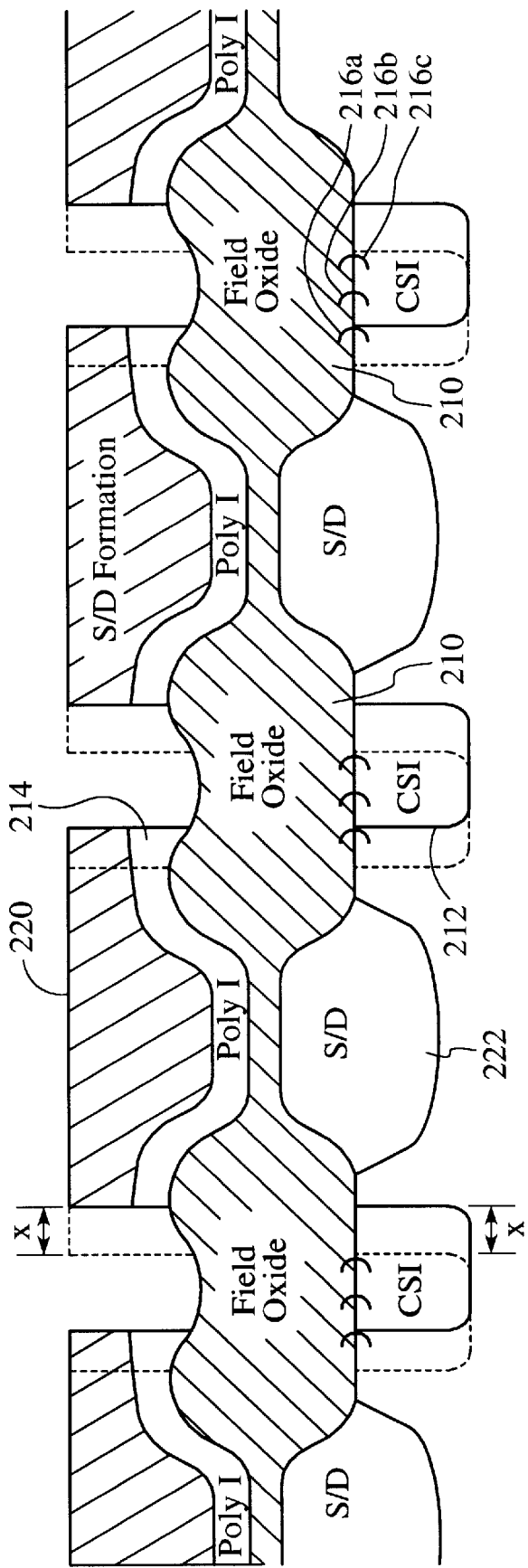

Returning now to FIG. 6, in FIG. 6F, a device according to the present invention is shown where the field oxide 210 has been formed with an uneven surface such that the center region of the field oxide has a thickness which is less than the thickness of the outer regions of the field oxide 210. For example, the center region can have a field oxide thickness of approximately 1500 angstroms, while the outer regions can have a thickness of approximately 2000 angstroms. On the surface of the field oxide 210, there is preferably a valley in the center of the surface of the field oxide 210. As previously discussed, by using this configuration, a substantially uniform amount of energy can be utilized in the CSI implantation. Consequently, the peak concentration of the implant is preferably within the boundaries of the field oxide for the outer regions of the field oxide 210, while the peak concentration of the implant near the center region of the field oxide 210 is below the boundaries of the field oxide.

Figure 6G:
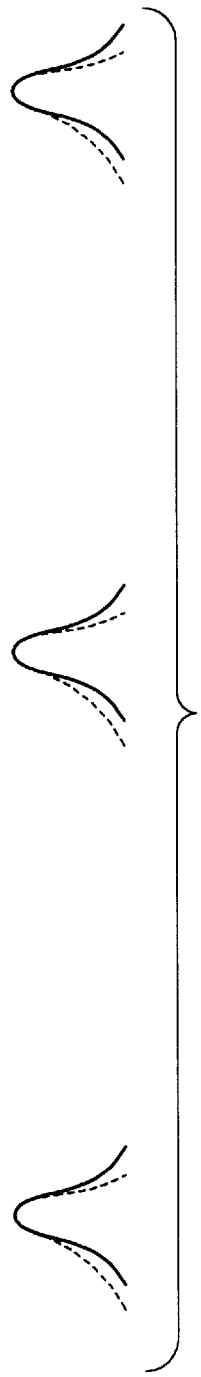

FIG. 6G shows an implant profile produced by a method or device according to the present invention. The implant profile for the present invention has a curved peak which falls off in both directions exponentially. The peak is caused by the peak concentration 216b below the center region of the field oxide 210, while the exponential drop from the peak is caused by the peak concentrations 216a and 216c near the outer regions of the field oxide 210. With the peak concentration 216a and 216c being within the field oxide 210, only the straggle portion of the gaussian implant concentration curve is located outside the field oxide 210. Thus, the implant concentration drops sharply from the region below the center of the field oxide 210.

If a misalignment of the mask 220 occurs, where the mask 220 is misaligned by a distance of x', then the dashed line in FIG. 6F shows the difference in the implant concentration profile for a misaligned mask 220. The peak concentration under the center of the field oxide 210 is essentially insensitive to misalignment of the mask 220. Consequently, the high implant concentration area CSI 212 will be located away from the source/drain junction 222 regardless of whether there is an error resulting in misalignment of the mask 220.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a semiconductor device including a substrate, a field oxide, the field oxide including a field oxide boundary wherein the field oxide is located within the boundary, the field oxide also including a thinner center region and thicker outer regions, the method comprising the steps sequentially of:

a) implanting a first implant concentration into the substrate, including areas proximate in distance to a junction area; and b) implanting a second implant concentration through the thinner center region of the field oxide and near in distance to the field oxide boundary to form a channel stop implant, wherein the implant of the second implant concentration is independent of a misalignment of a mask.

2. The method of claim 1, wherein the implanting of the second implant area includes targeting the implanting of a first portion of the second implant area which is closer in distance to the junction area than a second portion of the second implant area, the targeting for the first portion being performed such that a location of a peak concentration of implant material is located within the field oxide boundary.

3. The method of claim 2, wherein a targeting of the implant material for the second portion of the second implant area is performed such that a location of the peak concentration of the implant material is located in an area outside the field oxide boundary.

4. The method of claim 2, wherein a shape of the field oxide influences the location of the first portion to be targeted for the peak concentration of the implant material.

5. The method of claim 2, wherein the energy of the second implant is substantially uniform throughout the field oxide.

* * * * *